(12) United States Patent
Rastegar et al.

(10) Patent No.: US 11,177,100 B2
(45) Date of Patent: Nov. 16, 2021

(54) SELF-POWERED PIEZOELECTRIC-BASED PROGRAMMABLE ELECTRONIC IMPULSE SWITCHES

(71) Applicant: Omnitek Partners LLC, Ronkonkoma, NY (US)

(72) Inventors: Jahangir S Rastegar, Stony Brook, NY (US); Philip C Kwok, West Babylon, NY (US)

(73) Assignee: OMNITEK PARTNERS LLC, Ronkonkoma, NY (US)

( * ) Notice: Subject to any disclaimer, the term of this patent is extended or adjusted under 35 U.S.C. 154(b) by 616 days.

(21) Appl. No.: 16/105,938

(22) Filed: Aug. 20, 2018

(65) Prior Publication Data
US 2019/0057826 A1    Feb. 21, 2019

Related U.S. Application Data

(60) Provisional application No. 62/548,362, filed on Aug. 21, 2017.

(51) Int. Cl.
| | |
|---|---|
| *H02N 2/18* | (2006.01) |
| *H01H 35/14* | (2006.01) |
| *F42C 11/00* | (2006.01) |
| *F42C 11/02* | (2006.01) |

(52) U.S. Cl.
CPC .......... *H01H 35/14* (2013.01); *F42C 11/008* (2013.01); *F42C 11/02* (2013.01); *H02N 2/181* (2013.01); *H02N 2/183* (2013.01)

(58) Field of Classification Search
CPC .............. H01L 41/113; H01L 41/1132; H01L 41/1134; H01L 41/1136; H01L 41/1138; H02N 2/18; H02N 2/181; H02N 2/183; H02N 2/185; H02N 2/186; H02N 2/188
USPC .......................................................... 310/339
See application file for complete search history.

(56) References Cited

U.S. PATENT DOCUMENTS

| | | | | |
|---|---|---|---|---|
| 3,337,758 A | * | 8/1967 | Brothers | F42C 11/02 |
| | | | | 310/319 |
| 2009/0309458 A1 | * | 12/2009 | Chou | H02N 2/18 |
| | | | | 310/339 |
| 2013/0341936 A1 | * | 12/2013 | Wood | H02N 2/188 |
| | | | | 290/1 R |

* cited by examiner

*Primary Examiner* — Derek J Rosenau

(57) ABSTRACT

A piezoelectric generator for generating power upon an acceleration and upon a deceleration of a body. The piezoelectric generator including: first and second masses; first and second springs, the first spring being connected to the body at one end and to the first mass at an other end, the second spring being connected to the body at one end and to the second spring at an other end; and a piezoelectric material connected to the first and second masses such that the piezoelectric material generates power when the body is accelerated or decelerated.

5 Claims, 14 Drawing Sheets

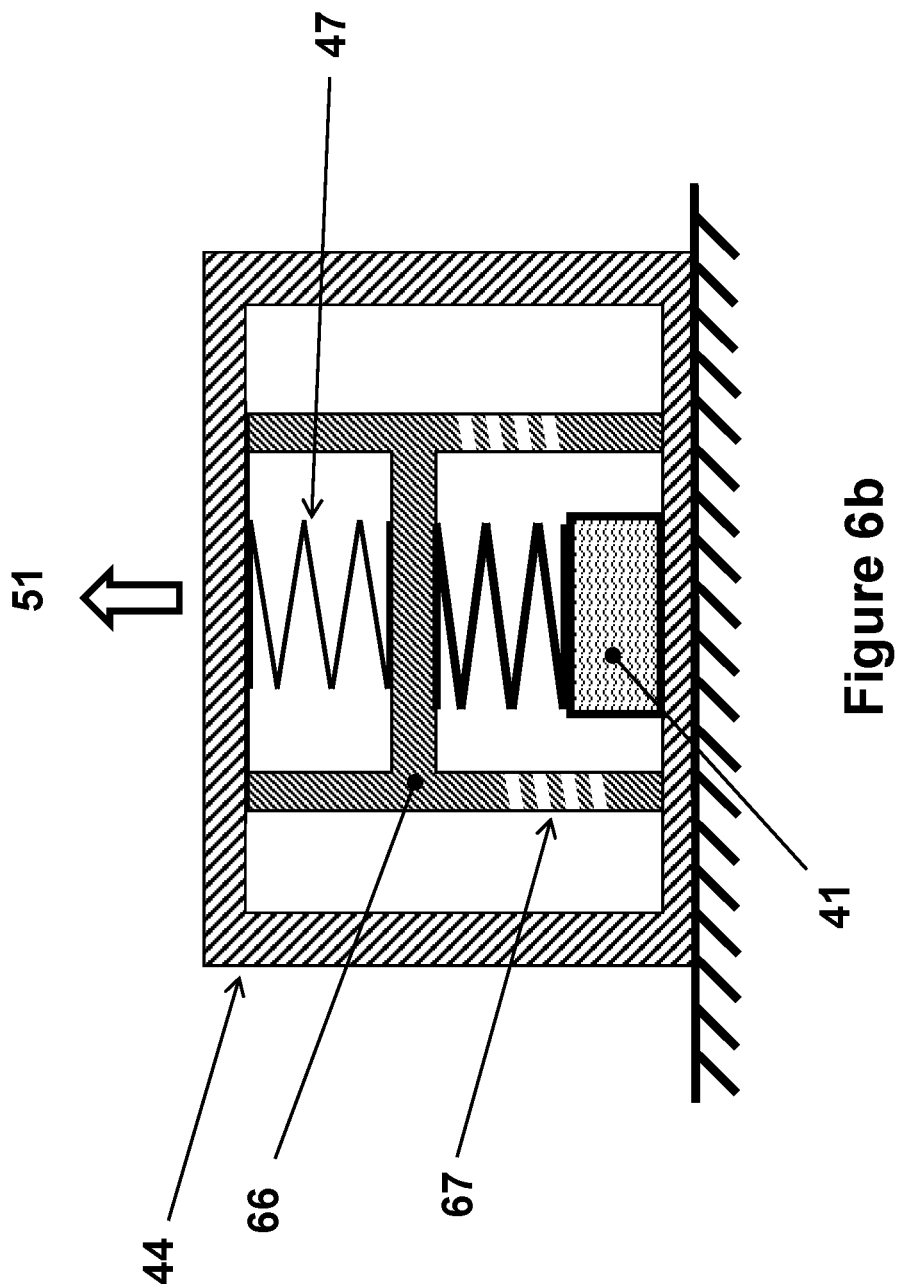

SELF-POWERED PIEZOELECTRIC-BASED PROGRAMMABLE ELECTRONIC IMPULSE SWITCHES

CROSS-REFERENCE TO RELATED APPLICATION

This application claims the benefit of priority to U.S. Provisional Application No. 62/548,362 filed on Aug. 21, 2018, the entire contents of which is incorporated by reference.

BACKGROUND

1. Field

The present disclosure relates generally to electronic impulse switching devices and more particularly with self-powered piezoelectric-based electronic impulse switches that are readily programmed for detecting acceleration pulses with longer than a prescribed duration and higher than a prescribed level, such as those generated during impact.

2. Prior Art

A G-switch or inertial switch is a switch that can change its state, for example, from open to close, in response to acceleration and/or deceleration. Hereinafter, the term acceleration is intended to also include deceleration unless otherwise indicated and the disclosed devices are readily seen by those skilled in the art that can be configured to react to either acceleration or deceleration events by their reorientation or to both acceleration and deceleration with the disclosed designs. For example, when the acceleration along a particular direction exceeds a certain threshold value, the inertial switch changes its state, which change can then be used to trigger an electrical circuit controlled by the inertial switch. Inertial switches are employed in a wide variety of applications such as automobile airbag deployment systems, vibration alarm systems, detonators for artillery projectiles, and motion-activated light-flashing footwear. Description of several representative prior-art inertial switches can be found, for example, in U.S. Pat. Nos. 7,212,193, 6,354,712, 6,314,887, 5,955,712, 5,786,553, 4,178,492, and 4,012,613, the teachings of all of which are incorporated herein by reference.

To ensure safety and reliability, inertial switches for electrical circuits should not activate (open or close electrical circuits) during acceleration events which may occur during manufacture, assembly, handling, transport, accidental drops, or other similar accidental events. Additionally, once subjected to an intended acceleration profile, such as those particular to the firing of ordinance from a gun or other similarly intended events such as impact (deceleration) events of long enough duration such as vehicular accidents as to be distinguished from encountering a bump or pot hole in the road or vibration encountered in rough roads such as for off-road vehicles, or the like, the device should activate with high reliability. In many applications, these two requirements often compete with respect to acceleration magnitude, but differ greatly in duration, i.e., essentially induced impulse. For example, an accidental drop may well cause very high acceleration levels—even in some cases higher than the firing of a shell from a gun. However, the duration of this accidental acceleration will be short, thereby subjecting shell to significantly lower resulting impulse levels. Such switches that activate when subjected to a minimum prescribed acceleration level for a minimum amount of time is hereinafter referred to as "impulse switches".

It is generally conceivable that the impulse switch will experience incidental low but long-duration accelerations, whether accidental or as part of normal handling, which must be guarded against activation. Again, the impulse switch will have a great disparity with that given by the intended activation acceleration profile because the magnitude of the incidental long-duration acceleration will be quite low.

The disclosed embodiments enable the user to readily "program" self-powered piezoelectric-based impulse switches, which are provided with false trigger protection logic, for almost any application circuitry, including several applications described in detail. The self-powered and programmable "impulse switches" disclosed herein may provide one or more of the following advantages over prior art mechanical or MEMS-based "G switches" or "inertial switches":

By only using a very few electronic components and essentially just one added resistor to match a prescribed application requirements, the impulse switches can be programmed to switch at any desired minimum acceleration or deceleration level and its duration;

The impulse switch electronics can be fabricated on a single simple chip for ease of packaging together with the piezoelectric element of the device to achieve very low cost;

Provide impulse switches that are self-powered and passive;

Provide impulse switches for electronic circuits that can be mounted directly onto the electronics circuits boards or the like, thereby significantly simplifying the electrical and electronic circuitry, simplifying the assembly process and total cost; significantly reducing the occupied volume, and eliminating the need for physical wiring to and from the impulse switches;

Provide impulse switches that eliminate the need for accelerometers and processors with their own power sources to measure the imparted acceleration or deceleration pulses and measure their duration to determine if a prescribed acceleration pulse event is to be considered as detected.

SUMMARY

A need therefore exists for low cost and easy to use and readily "programmable" electronic "impulse" switching devices that are self-powered for detecting acceleration pulses with longer than a prescribed duration and higher than a prescribed level, such as those experienced during munitions firing or target impact, or impacts during a vehicles accident, or the drop of a package that could damage its content, or the like.

A need also exists for impulse switches for electronic circuits that can be mounted directly onto the electronics circuits boards or the like, thereby significantly simplifying the electrical and electronic circuitry, simplifying the assembly process and total cost, reducing the occupied volume, and eliminating the need for physical wiring to and from the impulse switch.

Accordingly, a self-powered piezoelectric-based programmable impulse switch that is constructed with a very few components and with false trigger protection logic is disclosed. The self-powered impulse switch provides the means for the user system to detect acceleration or deceleration or both acceleration and deceleration pulses that are longer in duration and higher in amplitude than prescribed levels, such as those experienced during munitions firing or target impact, or impacts during a vehicles accident, or the drop of a package that could damage its content, or the like.

Also disclosed are method of using the self-powered and programmable impulse switches to construct constructed devices that perform the certain designed functions upon detection of prescribed acceleration pulse and are provided with false trigger protection.

It is appreciated by those skilled in the art that in many applications, it is critical to differentiate events that result in high acceleration magnitudes with relatively long duration, such as a vehicle impact due to an accident, from events with relatively high acceleration magnitudes but short duration, such as hitting of a pot hole or the like, for deploying air bags. In such applications, these two requirements compete with respect to acceleration magnitude, but differ greatly in their duration.

BRIEF DESCRIPTION OF THE DRAWINGS

These and other features, aspects, and advantages of the apparatus of the present invention will become better understood with regard to the following description, appended claims, and accompanying drawings where:

FIG. 1 illustrates a piezoelectric-based electrical energy generator component of a self-powered device that is intended to generate electrical energy when subjected to an acceleration pulse for use in impulse switch embodiments and the like.

FIG. 2 illustrates a piezoelectric-based electrical energy generator component of a self-powered device that is designed to generate electrical energy when subjected to either an acceleration or a deceleration pulse for use in impulse switch embodiments and the like.

FIG. 3 illustrates an alternative piezoelectric-based electrical energy generator component of a self-powered device that is designed to generate electrical energy when subjected to either an acceleration or a deceleration pulse for use in impulse switch embodiments and the like.

FIG. 4a illustrates an alternative piezoelectric-based electrical energy generator component of a self-powered device that is designed to generate electrical energy when subjected to an acceleration pulse above a prescribed threshold for use in impulse switch embodiments and the like.

FIG. 5 illustrates another alternative piezoelectric-based electrical energy generator component of a self-powered device that is designed to generate electrical energy when subjected to an acceleration pulse above a prescribed threshold for use in impulse switch embodiments and the like.

FIG. 6a illustrates a modified version of the piezoelectric-based electrical energy generator of FIG. 5 that is designed to generate electrical energy when subjected to an acceleration pulse above a prescribed threshold with a mechanism to limit the level of piezoelectric element loading for use in impulse switch embodiments and the like.

FIG. 6b illustrates a modified version of the piezoelectric-based electrical energy generator embodiment of FIG. 6a that is constructed by a machined component that integrates several components of the generator.

FIG. 10 illustrates the circuit diagram of the first impulse switch embodiment using one of the piezoelectric-based electrical energy generators shown schematically in FIGS. 1-7 or the like.

DETAILED DESCRIPTION OF THE PREFERRED EMBODIMENT

Figure 1:
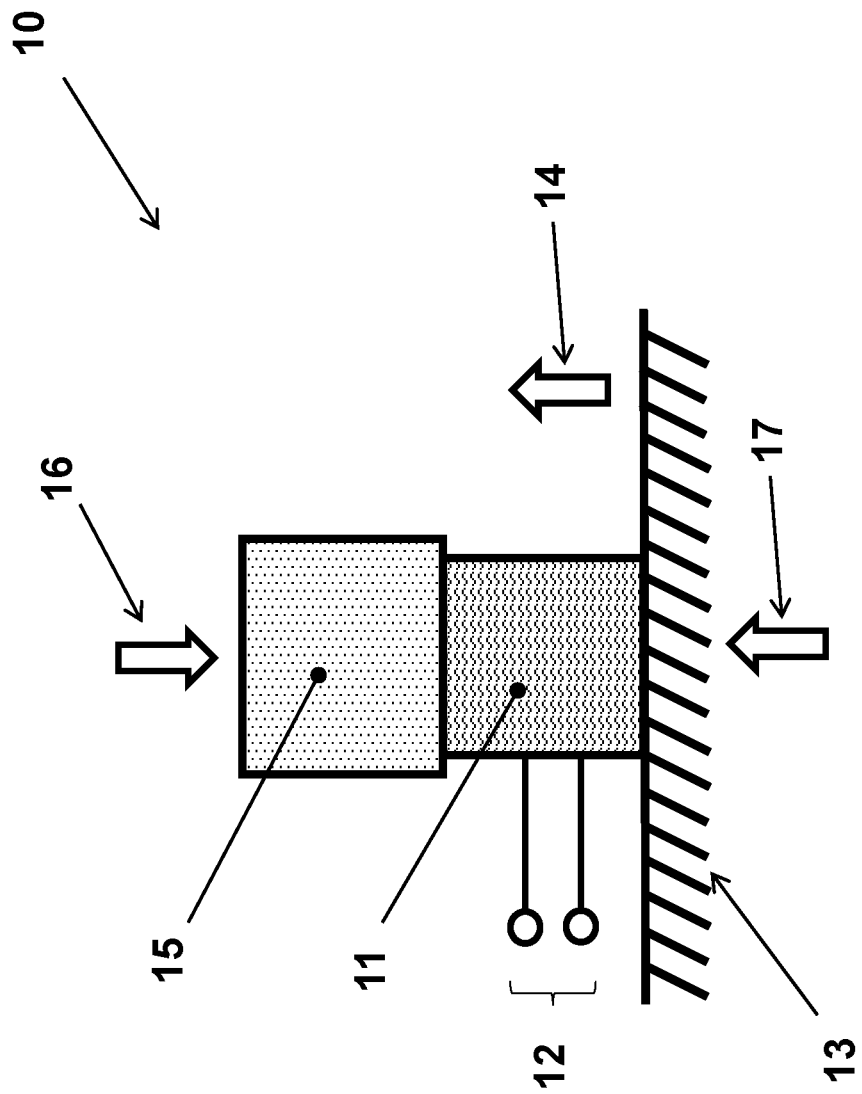

A piezoelectric electrical energy generator 10, usually with a stack type piezoelectric element 11, that is used in self-powered devices to generate electrical energy when the device is subjected to shock loading, for example due to an acceleration pulse, is shown in the schematic of FIG. 1. In the configuration shown in FIG. 1, the piezoelectric electrical energy (charge) generator 10 is shown as rigidly attached to a base structure 13, which is considered to be subjected at a certain point in time to an acceleration pulse in the direction of the arrow 14. A relatively rigid mass 15 may also be required to react to the acceleration 14 and apply a resulting compressive force 16 to the piezoelectric element 11. Then as a result of the compressive force 16 and the internal normal compressive pressure generated in the piezoelectric element 11 due to its own mass as a result of the acceleration pulse, the piezoelectric element 11 is strained (deformed) axially, and would thereby generate electrical charges at its electrodes as is well known in the art. The leads 12, properly connected to the electrodes of the piezoelectric element, would make the generated charges available for collection and conditioning as described below for the different embodiments.

In a piezoelectric-based self-powered device application such as the present impulse switch embodiments, a piezoelectric electrical energy generator similar to the one shown in FIG. 1 may be used to provide electrical energy (charges) to power the device to perform its described function. The piezoelectric electrical energy generator type shown in FIG. 1 is however suitable mainly for detecting acceleration in the direction of the arrow 14, which subjects the piezoelectric element to compressive loading. This is the case since piezoelectric materials commonly used are brittle and can only withstand a small fraction of the allowable compressive loading in tension, which is generated when the piezoelectric generator 10 of FIG. 1 is subjected to deceleration, i.e., when the base 13 is subjected to deceleration event, such as if it is impacted by a force in the direction of the arrow 17. Therefore, the piezoelectric generator 10 cannot be used in impulse switches that are expected to be subjected to the same levels of acceleration and deceleration events.

Figure 2:
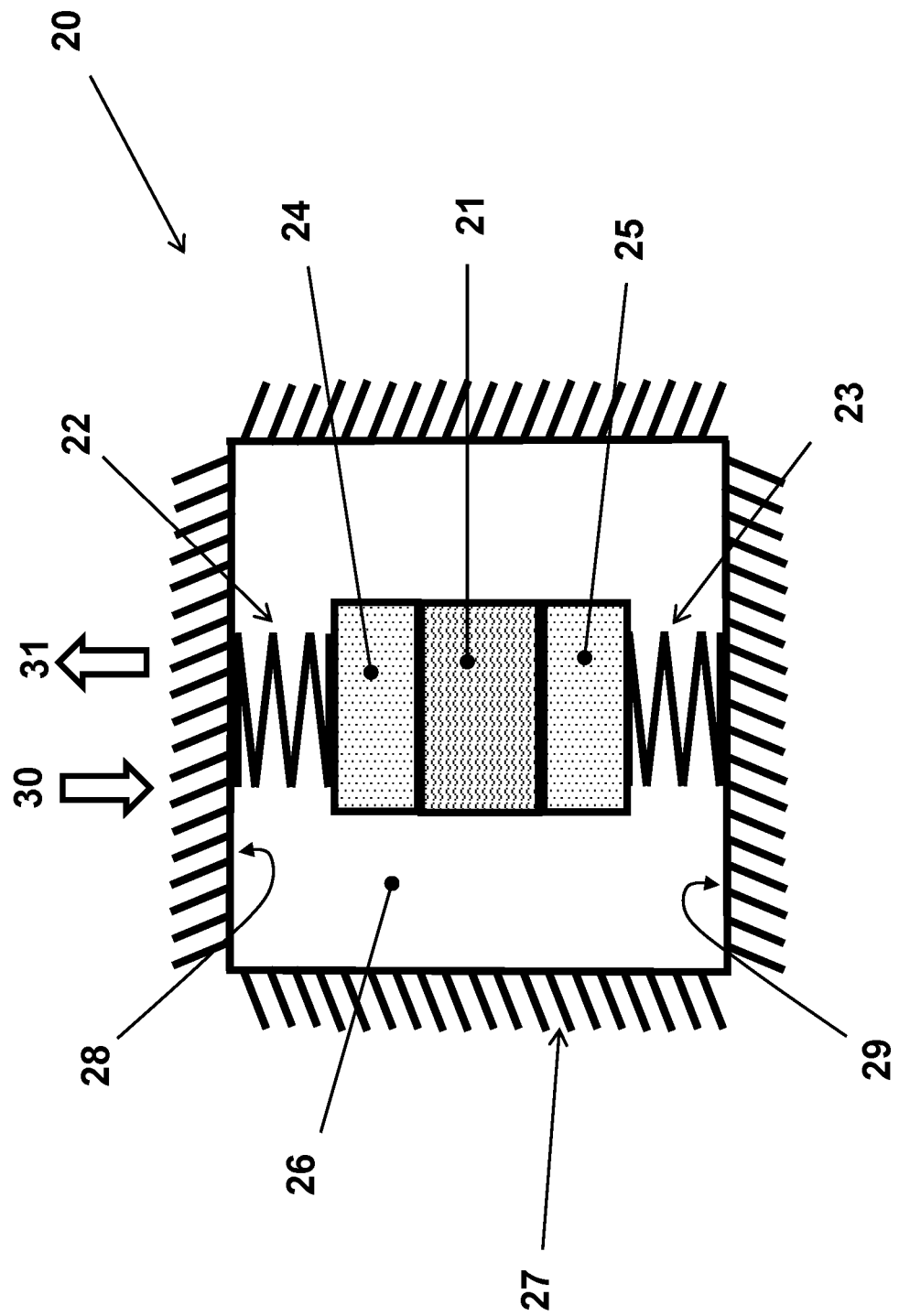

A method of packaging a piezoelectric element generator to make it capable of responding effectively to both acceleration and deceleration events is shown in the schematic of FIG. 2. In FIG. 2, the piezoelectric element 21 of the generator (indicated by the numeral 20), is shown to be positioned between two compressively preloaded springs 22 and 23. One or both mass elements 24 and 25 may also be provided as shown in FIG. 2 to increase the level of acceleration and/or deceleration to be detected and the required spring rate and preloading of the springs 22 and 23. The assembly of the piezoelectric 21, springs 22 and 23, and mass elements 24 and 25 are packaged inside the space 26 provided in the housing 27 as shown in FIG. 2, with the compressively preloaded springs 22 and 23 resting against the top and bottom surfaces 28 and 29, respectively, as viewed in FIG. 2.

Then when the piezoelectric electrical energy generator 20 is subjected to acceleration in the direction of the arrow 31 (which corresponds to deceleration in the direction of the arrow 30), the acceleration acts on the total inertia (mass) of the piezoelectric element 21 and the masses 24 and 25 and the effective mass of the springs 22 and 23, and thereby causing the spring 23 to be subjected to an added compressive force and therefore being further deflected. The resulting upward movement of the assembly of the piezoelectric electric element 21 and masses 24 and 25 results in the extension of the spring 22, thereby reducing its level of compressive preloading. As a result, the piezoelectric element 21 is subjected to a net change in its compressive loading corresponding to the increase in the compressive force of the spring 23 and decrease in the compressive force of the spring 22, which is essentially the force generated by the applied acceleration to the total inertia (mass) of the piezoelectric element 21 and the masses 24 and 25 and the effective mass of the springs 22 and 23. The net compressive force would then cause the piezoelectric element 21 to generate a charge at a voltage that is nearly proportional to the magnitude of the applied compressive force, thereby proportional to the level of acceleration in the direction of the arrow 31 (which corresponds to deceleration in the direction of the arrow 30).

When the piezoelectric electrical energy generator 20 is subjected to acceleration in the direction of the arrow 30 (which corresponds to deceleration in the direction of the arrow 31), the acceleration will similarly act on the total inertia (mass) of the piezoelectric element 21 and the masses 24 and 25 and the effective mass of the springs 22 and 23, and thereby causing the spring 22 to be subjected to an added compressive force and therefore being further deflected. The resulting upward movement of the assembly of the piezoelectric electric element 21 and masses 24 and 25 results in the extension of the spring 23, thereby reducing its level of compressive preloading. The piezoelectric element 21 is thereby similarly subjected to a net compressive force, which is again essentially the force generated by the applied acceleration to the total inertia (mass) of the piezoelectric element 21 and the masses 24 and 25 and the effective mass of the springs 22 and 23. The net compressive force would then cause the piezoelectric element 21 to generate a charge at a voltage that is nearly proportional to the magnitude of the applied compressive force, thereby proportional to the level of acceleration in the direction of the arrow 30 (which corresponds to deceleration in the direction of the arrow 31).

The piezoelectric electrical energy generator 20 can therefore be used to construct impulse switches described later in this disclosure that could be subjected to either acceleration or deceleration for their activation.

It will be appreciated by those skilled in the art that the compressive preloading of the springs 22 and 23 can be high enough to so that under maximum applied acceleration and/or deceleration levels the springs do not completely lose their compressive loading and lose contact either with the mass 23 or 24 (when present or the piezoelectric element 21 when not present) or with the interior surface 28 or 29 of the space 26 provided in the housing 27.

It is also appreciated by those skilled in the art that the piezoelectric electrical energy generator 20 would generate a charge with the same polarity when subjected to either acceleration or deceleration pulses.

Figure 3:
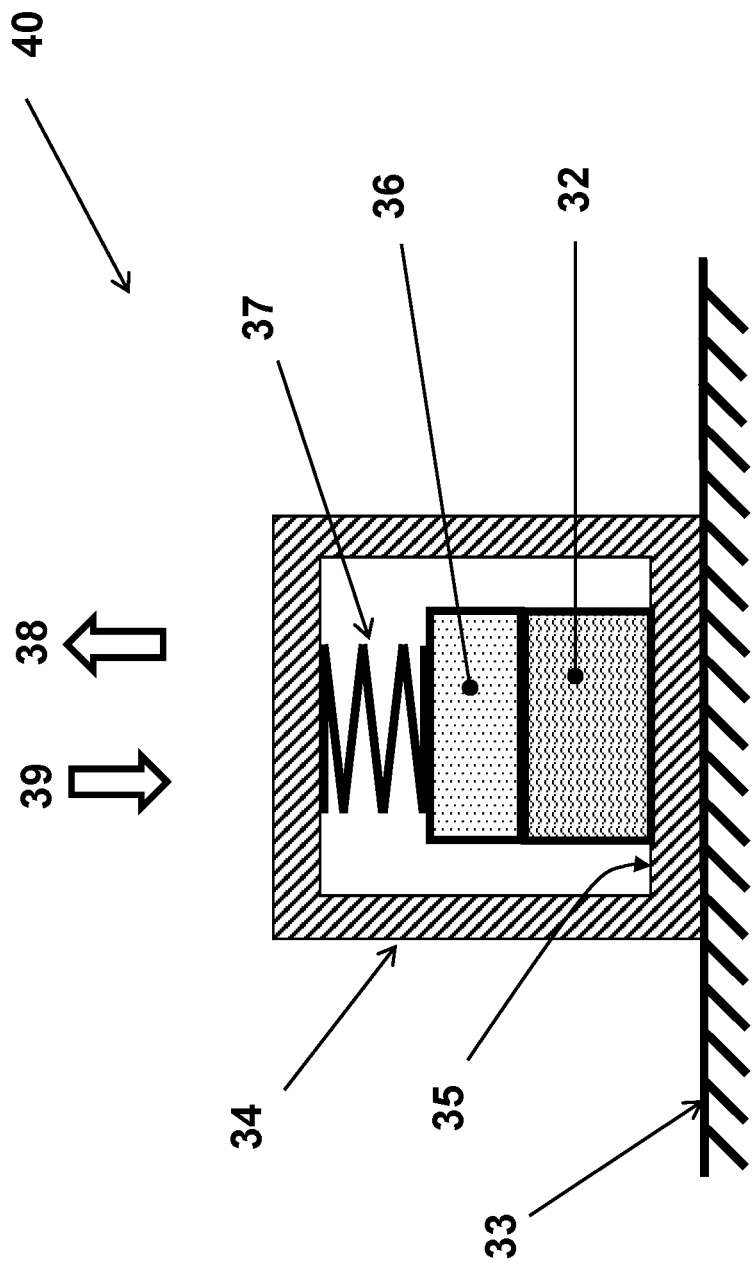

An alternative method of packaging a piezoelectric element generator to make it capable of responding effectively to both acceleration and deceleration events is shown in the schematic of FIG. 3. In FIG. 3, the piezoelectric element 32 of the generator (indicated by the numeral 40), is shown to be attached to the base surface 35 of the generator housing 34. The generator housing 34 is in turn fixedly attached to the object 33, which is to be subjected to acceleration and/or deceleration pulses. A compressively preloaded spring 37 is also provided inside the housing 34 to keep the piezoelectric element under compressive loading. A mass element 36 may also be provided between the spring 37 and the piezoelectric element 32 to increase the compressive force acting on the piezoelectric element when the piezoelectric element generator 40 is subjected to acceleration in the direction of the arrow 38, i.e., when the object 33 is accelerated in the direction of the arrow 38, and increase the level of compressive force reduction on the piezoelectric element when the piezoelectric element generator 40 is subjected to acceleration in the direction of the arrow 39, i.e., when the object 33 is accelerated in the direction of the arrow 39 (corresponding to being decelerated if it was moving in the direction of the arrow 38 prior to being subjected to the deceleration pulse).

Then when the object 33 and thereby the piezoelectric electrical energy generator 40 is subjected to acceleration in the direction of the arrow 38, the acceleration acts on the total inertia (mass) of the piezoelectric element 32 and the mass 36 and the effective mass of the spring 37, thereby proportionally increasing the compressive loading of the piezoelectric element 32. The increase in the compressive loading of the piezoelectric element 32 would then cause the piezoelectric element to generate a charge at a voltage that is nearly proportional to the magnitude of the increase in the applied compressive force, thereby proportional to the level of acceleration in the direction of the arrow 38 (which also corresponds to deceleration in the direction of the arrow 39).

When the piezoelectric electrical energy generator 40 is subjected to acceleration in the direction of the arrow 39 (which corresponds to deceleration in the direction of the arrow 38), the acceleration will similarly act on the total inertia (mass) of the piezoelectric element 36 and the effective mass of the spring 37, thereby proportionally decreasing the compressive loading of the piezoelectric element 32. The reduction in compressive loading of the piezoelectric element 32 would then cause the piezoelectric element to generate a charge at a voltage that is nearly proportional to magnitude of the applied compressive force reduction, thereby proportional to the level of acceleration in the direction of the arrow 39 (which also corresponds to deceleration in the direction of the arrow 38). The polarity of the generated charge voltage will be opposite to the polarity of the charge voltage generated as a result aforementioned acceleration in the direction of the arrow 38 since the piezoelectric element 32 is now being subjected to a tensile force, which is superimposed over the compressive preloading force applied by the spring 37. The level of compressive preloading of the spring 37 can be higher than the maximum reduction in the compressive force applied to the piezoelectric element so that the piezoelectric element is at no time subjected to a tensile loading.

The piezoelectric electrical energy generator 40 can therefore also be used to construct impulse switches described later in this disclosure that could be subjected to either acceleration or deceleration for their activation.

It will also appreciated by those skilled in the art that unlike the piezoelectric electrical energy generator 20 of FIG. 2, the piezoelectric electrical energy generator of FIG. 3 would generate a charge with opposite polarity when subjected to acceleration and deceleration pulses.

It is appreciated by those skilled in the art that the piezoelectric electrical energy generator embodiments of FIGS. 1-3 would respond to almost any level of applied acceleration or deceleration and generate an electrical charge at a certain voltage. It is, however, piezoelectric electrical energy generators can be provided that would generate nearly zero charges and thereby voltages when subjected to accelerations or decelerations below a certain threshold. Such piezoelectric electrical generators would thereby provide the means of constructing impulse switches that would not activate when subjected to accelerations or deceleration below the thresholds. Such acceleration and/or deceleration thresholds may, for example, be provided to ensure that if the object or device equipped with the impulse switch is subjected to incidental acceleration and/or deceleration pulses that should be ignored, for example if a vehicle encounters a pot hole, the impulse switch would not activate as if the vehicle has impacted another vehicle or a fixed structure.

Figure 4A:
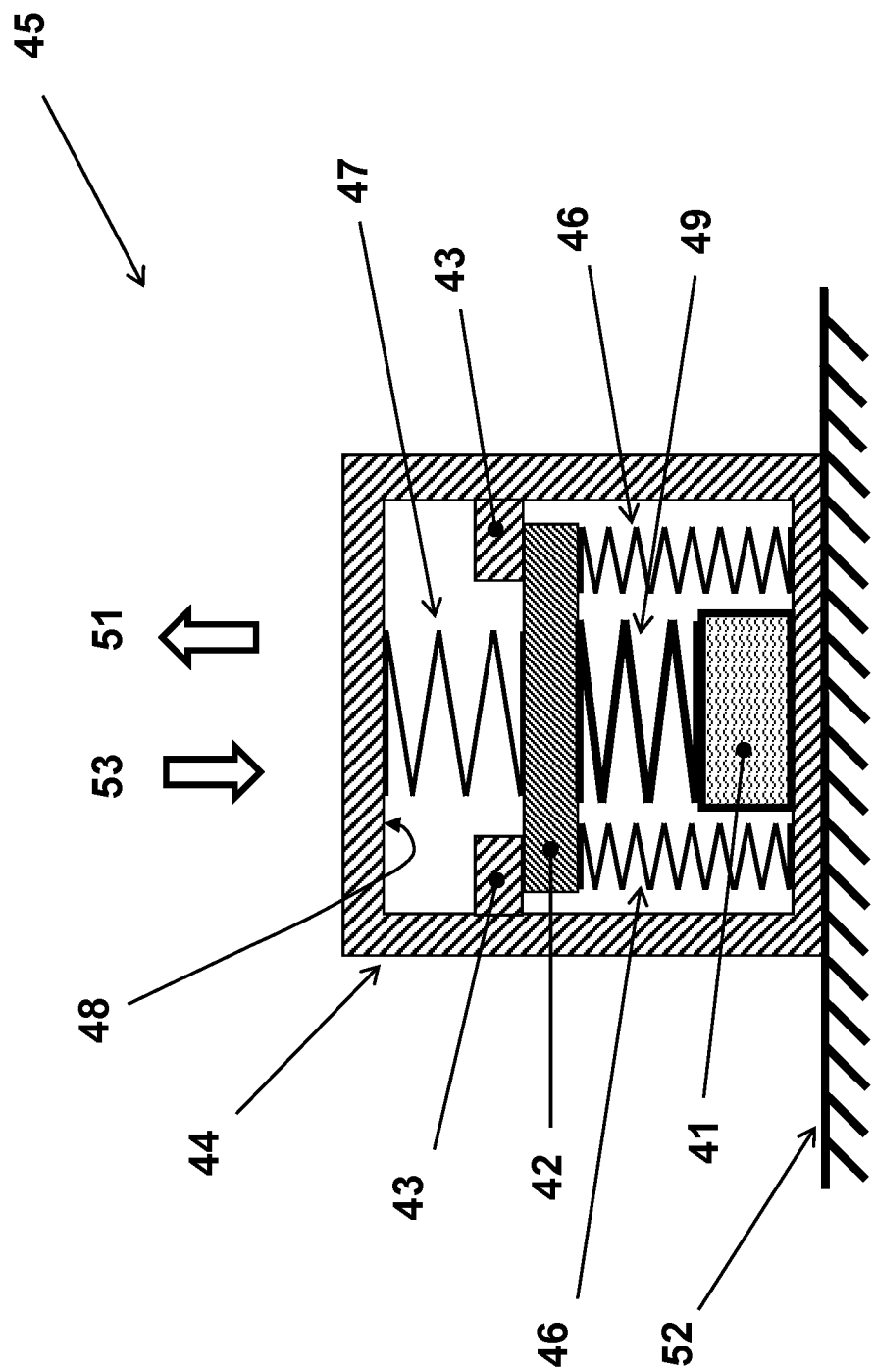
Figure 4B:
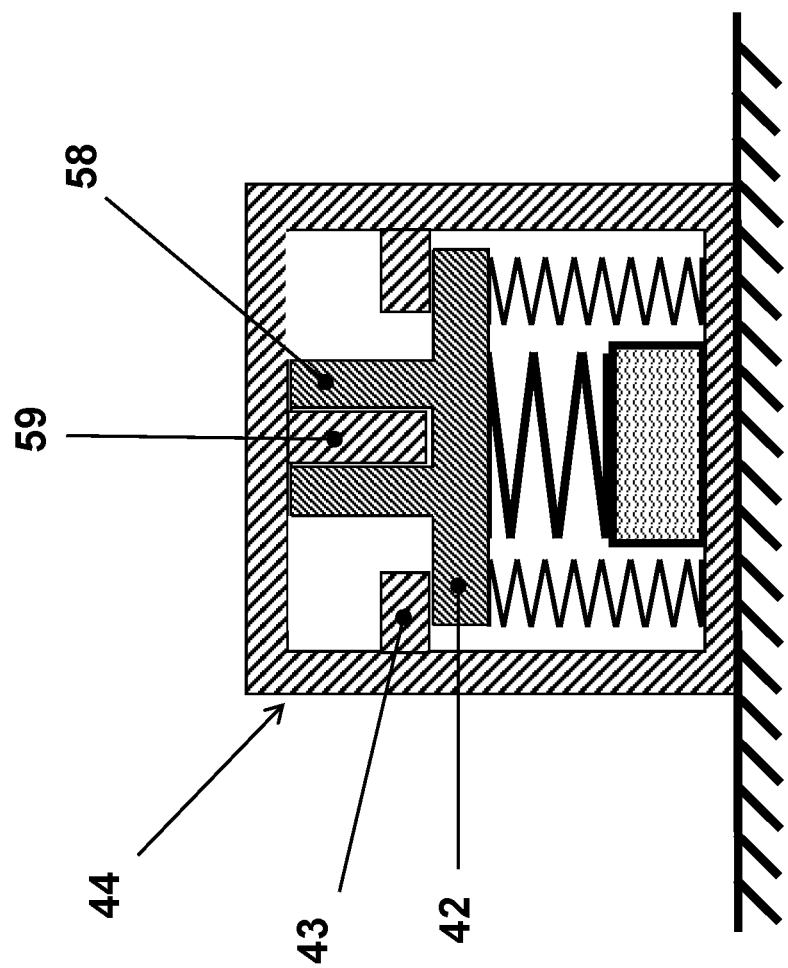
FIG. 4b illustrates a modified version of the piezoelectric-based electrical energy generator embodiment of FIG. 4a that is provided with stabilizing guides for the displacing relatively rigid member of the assembly.

A method of packaging a piezoelectric element generator to make it capable of generating electrical energy only when the applied acceleration pulse has a magnitude above a prescribed threshold is shown in the schematic of FIG. 4a. The piezoelectric element 41 of the generator (indicated by the numeral 45), is shown to be positioned (such as fixedly attached) to the base of the piezoelectric element generator 45 housing 44 on one side and the compressively preloaded spring 49 on the other side as shown in FIG. 4a. The compressively preloaded spring 49 in turn rests against a relatively rigid plate 42 as shown in FIG. 4a. At least one compressively preloaded spring 46 and the compressively preloaded spring 49 are then used to press the relatively rigid plate 42 against the stops 43 provided inside the housing 44 of the piezoelectric element generator 45. A relatively soft compressively preloaded spring 47 may also be positioned between the top surface 48 of the housing 44 of the piezoelectric generator 45 and the relatively rigid plate 42 to provide for increased stability during the impulse switch acceleration shock loading. The generator housing 44 is in turn fixedly attached to the object 52, which is to be subjected to acceleration and/or deceleration pulses.

The mass of the relatively rigid plate 42 and the spring rates of the springs 46, 47 and 49, their effective mass and their levels of compressive preloading are parameters that are selected to match the aforementioned acceleration threshold above which the piezoelectric element generator 45 is intended to begin to generate a voltage due to the applied acceleration pulse in the direction of the arrow 51.

Then when the piezoelectric electrical energy generator 45 is subjected to an increasing level of acceleration in the direction of the arrow 51 (which corresponds to deceleration in the direction of the arrow 53) by the object 52, the acceleration acts on the total inertia (mass) of the relatively rigid plate 42, and the effective mass of the springs 46, 47 and 49 (neglecting the generally small effective mass of the piezoelectric element 41), and thereby apply an increasingly larger added (inertial) force to the relatively rigid plate 42 (here, the preloaded compressive spring 49 can be considered to be fixedly attached to the relatively rigid plate 42). However, the preloading forces of the compressive springs 46 and 49 counteract the inertial force and prevent the relatively rigid plate 42 from moving downward as viewed in the schematic of FIG. 4a.

Now as the level of acceleration in the direction of the arrow 51 is increased, the piezoelectric electrical energy generator 45 can be designed by proper choice of the aforementioned device parameters so that at a prescribed acceleration threshold, the preloading forces of the compressive springs 46 and 49 are overcome by the inertial force that is generated by the acceleration in the direction of the arrow 51 acting on the mass of the relatively rigid plate 42 and the effective mass of the springs 46, 47 and 49. Then if the level of the acceleration increases beyond the prescribed threshold, the inertial force due to the acceleration level beyond the prescribed threshold would begin to deflect the compressive springs 46 and 49 further in compression, thereby causing the spring 49 to apply an increased compressive force to the piezoelectric element 41. As a result, the piezoelectric element 41 generates charges at a voltage that is nearly proportional to magnitude of the increased applied compressive force, thereby proportional to the level of acceleration in the direction of the arrow 51 above the prescribed acceleration threshold.

However, when the piezoelectric electrical energy generator 45 is subjected to acceleration in the direction of the arrow 53 (which corresponds to deceleration in the direction of the arrow 51), the acceleration acts on the total inertia (mass) of the relatively rigid plate 42, and the effective mass of the springs 46, 47 and 49 (again neglecting the generally small effective mass of the piezoelectric element 41), and thereby cause the relatively rigid plate 42 to apply an added (inertial) force to the stops 43. The force acting on the piezoelectric element is reduced only by the amount of inertia force due to the applied acceleration acting on the effective mass of the spring 49. In practice, by fixedly attaching the spring 49 to the relatively rigid plate 42 and using a relatively lightweight spring 49, for example by using a Belville washer made with carbon fibers, the reduction in the compressive loading of the piezoelectric element 41 can be made to be relatively negligible.

The piezoelectric electrical energy generator 45 can therefore be used to construct impulse switches described below that will be powered by the charges generated by the piezoelectric electrical energy generator only when the device is subjected to accelerations in the direction of the arrow 51 that have magnitudes larger than a prescribed acceleration threshold.

It will be appreciated by those skilled in the art that in the piezoelectric electrical energy generator 45, the housing 44 can be cylindrical and thereby the at least one spring 46 can be constructed as a single spring with an inner diameter to accommodate the piezoelectric element 41. In addition, the stops 43 can also be made cylindrical and extend to the housing inner surface 48. Alternatively, the cylindrically shaped stop may be integral to the housing 44.

Figure 5:
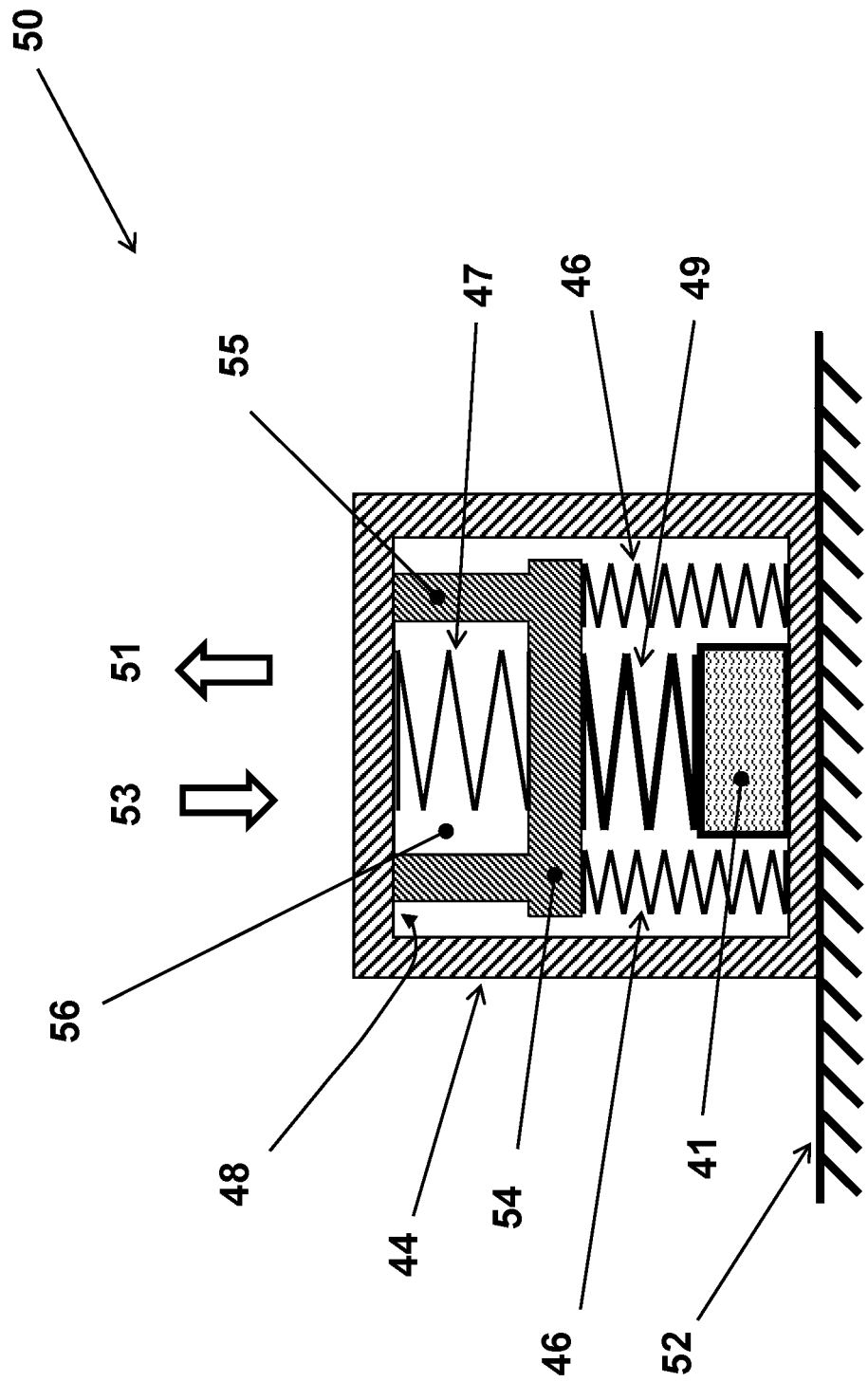

In an alternative embodiment 50 of the piezoelectric electrical energy generator 45 of FIG. 4a, the stops 43 can be integrated into the relatively rigid plate 42 instead of being fixed or integral to the housing 44 as shown in the schematic of FIG. 5. In the schematic of FIG. 5, all components of the piezoelectric electrical energy generator 50 are identical to those of the piezoelectric electrical energy generator 45 of FIG. 4a and are indicated by the same numerals except for the relatively rigid plate 42 and the stops 43, FIG. 4a, which are replaced by the relatively rigid member 54. The relatively rigid member 54 is provided with the pocket 56, in which the compressively preloaded spring 47 is positioned to perform the same function as in the embodiment of FIG. 4a. The "walls" 55 of the relatively rigid member 54 are then used to rest against the inner top surface 48 of the top surface of the housing 44 to function as the stops 43 in the embodiment of FIG. 4a to limit the upward motion of the relatively rigid member 54 (relatively rigid plate 42 in FIG. 4a) by the compressively preloaded springs 46 and 49. The piezoelectric electrical energy generator 50 otherwise functions exactly as the piezoelectric electrical energy generator 45 of FIG. 4a.

It will be appreciated by those skilled in the art that piezoelectric electrical energy generators 45 and 50 of FIGS. 4a and 5, respectively, as the level of acceleration in the direction of the arrow 51 is increased, the piezoelectric element is subjected to higher levels of compressive loading and thereby would generate higher levels of charges and corresponding voltages. In certain applications, the level of acceleration to be experienced by the object to which the impulse switch is attached may reach significantly higher than the level at which the impulse switch is to indicate as the event that is to be detected. For example, the impulse switch may be desired to detect an acceleration with a peak of 100 G that lasts at least 5 milliseconds, and as a result the piezoelectric element of the impulse switch is designed to generate near its maximum voltage at 100 G. However, the device in which the impulse switch is used may experience very short duration (significantly less than 5 milliseconds) acceleration pulse with peaks that could reach 2,000 G, for example due to accidental drop over hard surfaces. As a result of being subjected to loads that are up to 20 times larger than its activation loading levels, the piezoelectric element may fracture and fail. Therefore, it is highly desirable to provide overloading protection for the piezoelectric element of such impulse switches.

Figure 6A:
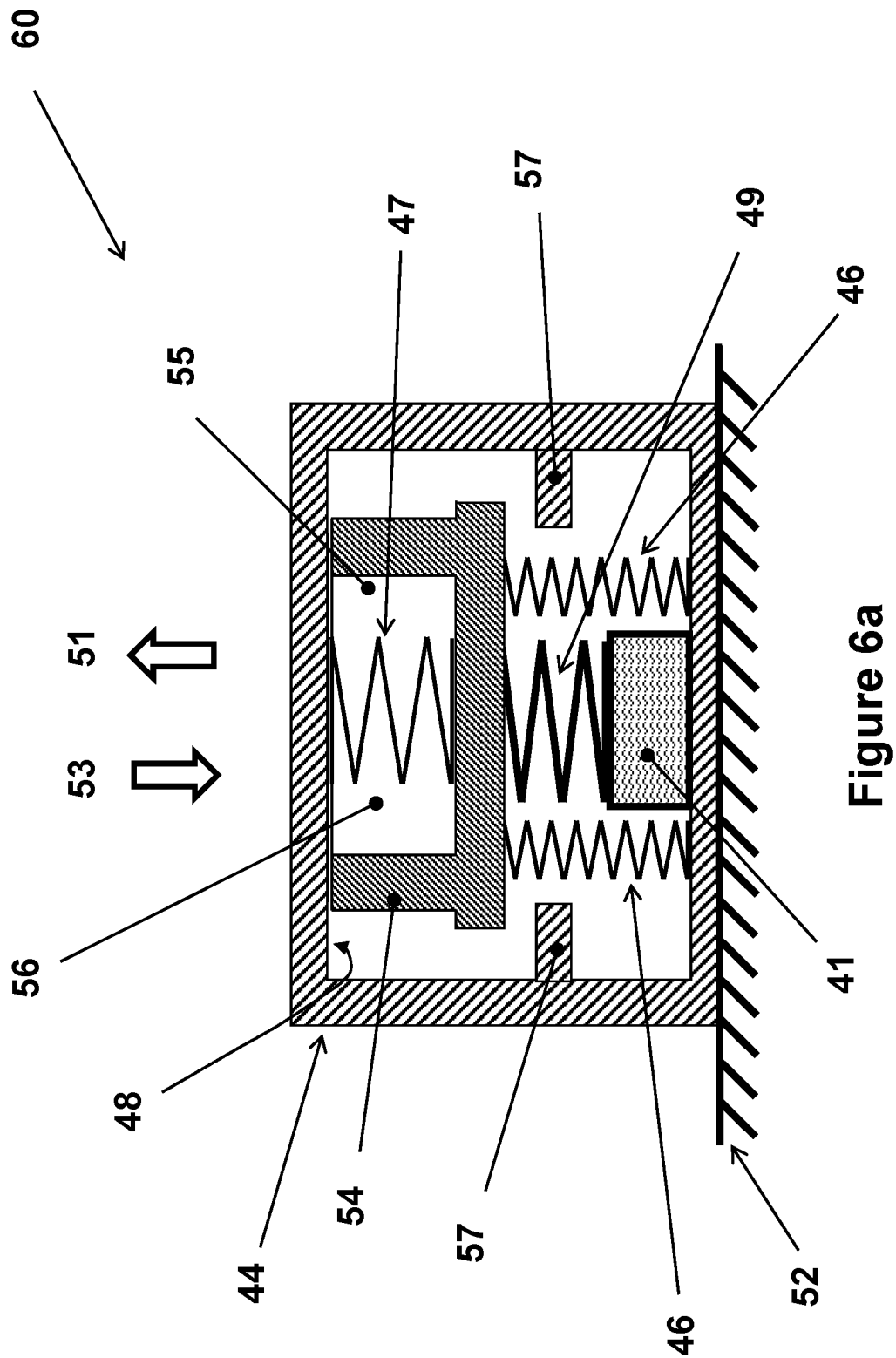

The piezoelectric electrical generator embodiment 60 of FIG. 6a is a modified version of the embodiment 50 of FIG. 5 to provide it with the means of providing overloading protection to the piezoelectric element 41 of the generator. In the schematic of FIG. 6a, all components of the piezoelectric electrical energy generator 60 are identical to those of the piezoelectric electrical energy generator 50 of FIG. 5 and are indicated by the same numerals except that the housing 44 is provided with the stops 57, which are used to limit downward movement of the relatively rigid member 54 (as viewed in FIG. 6a), thereby limiting the compressive force that is applied by the compressively preloaded spring 49 to the piezoelectric element 41. The piezoelectric electrical energy generator 60 otherwise functions exactly as the piezoelectric electrical energy generator 50 of FIG. 5.

Figure 7:
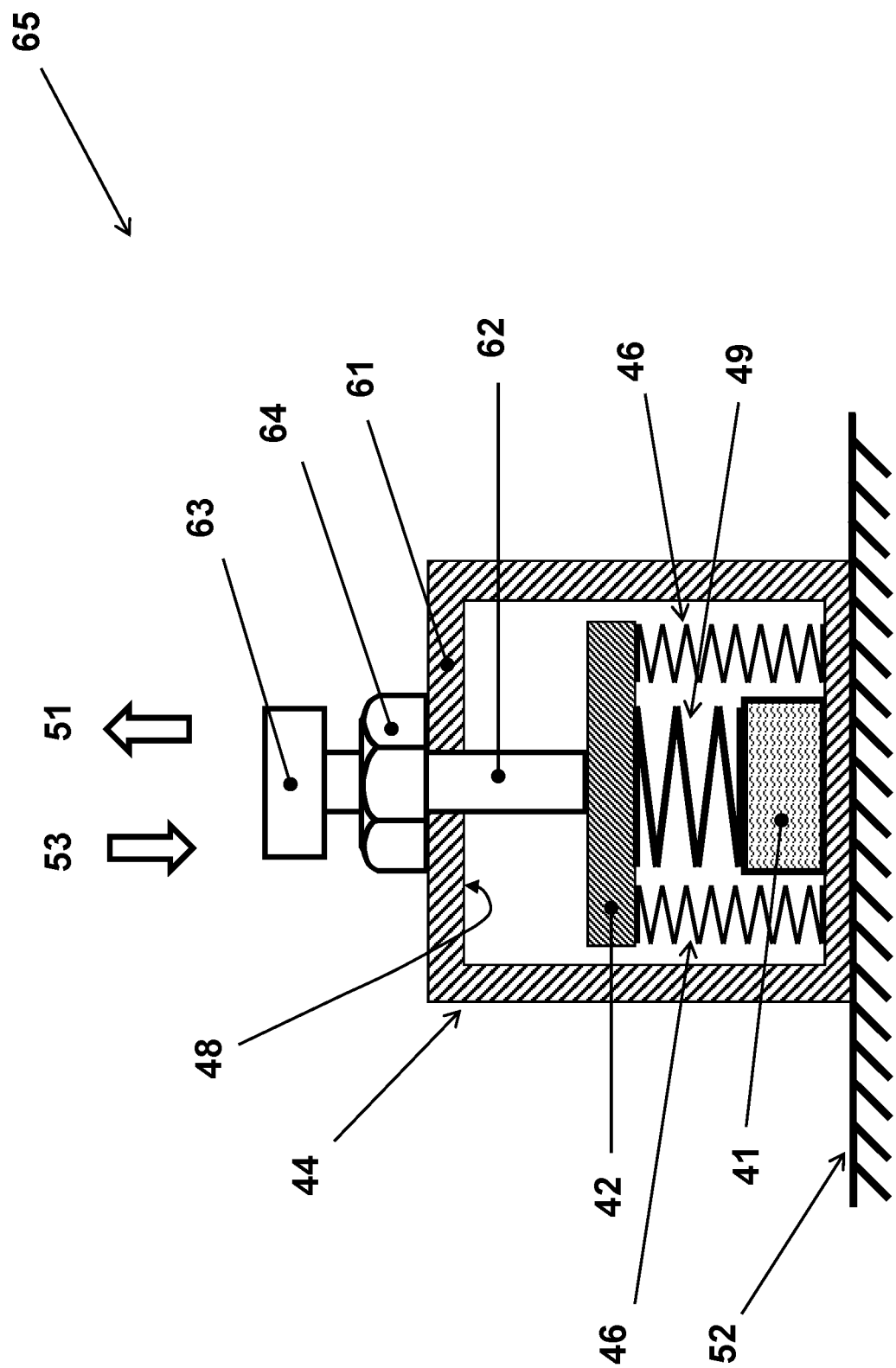
FIG. 7 illustrates a modified version of the piezoelectric-based electrical energy generator of FIG. 4 for use in impulse switch embodiments and the like with an adjustable compressive spring preloading mechanism.

The piezoelectric electrical generator embodiment 65 of FIG. 7 is a modified version of the embodiment 45 of FIG. 4a to provide it with the means of adjusting the compressive loading of the springs 46 and 49. In the schematic of FIG. 7, all components of the piezoelectric electrical energy generator 65 are identical to those of the piezoelectric electrical energy generator 45 of FIG. 4a and are indicated by the same numerals except that the stops 43 are removed and that the same function is provided by the bolt 62, which is screwed to a provided tapped hole in the cap 61 of the housing 44. In this embodiment, the bolt 62 is used to move the relatively rigid plate 42 up or down to adjust the compressive preloading level of the springs 46 and 47 by rotating the bolt head 63. In general, at least one nut 64 is also used to lock the bolt in position once the proper compressive preloading level of the springs has been achieved.

It is appreciated by those skilled in the art that many other mechanisms may also be used to perform the function of the adjusting bolt 62 in the piezoelectric electrical generator embodiment 65 of FIG. 7. For example, spaces of various thickness may be inserted between the top surface of the relatively rigid plate 42 and the top surface 48 of the housing 44 through a provided access hole (not shown) in the wall of the housing 44.

It is also appreciated by those skilled in the art that the compressive preloading adjusting mechanism of the piezoelectric electrical generator embodiment 65 of FIG. 7 may also be similarly provided to the embodiments of FIGS. 5 and 6a. In such an alternative embodiment of the piezoelectric electrical generator 65 of FIG. 7, the housing 44 is also provided with the stops 57, FIG. 6a, which are used to limit downward movement of the relatively rigid member 42 (as viewed in FIG. 7), thereby limiting the compressive force that is applied by the compressively preloaded spring 49 to the piezoelectric element 41. The piezoelectric electrical energy generators 60 and 65 of FIGS. 6a and 7, respectively, otherwise function exactly as the piezoelectric electrical energy generator 50 of FIG. 5.

It will also be appreciated by those skilled in the art that the compressively preloaded springs 47 of the piezoelectric electrical energy generator embodiments of FIGS. 4a, 5 and 6a only serve the purpose of providing stability to the motion of the relatively rigid plate 42 in the embodiment of FIG. 4a and the relatively rigid members 54 of the embodiments of FIGS. 5 and 6a, as they begin to displace by minimizing their possible lateral and wobbling motions. The compressively preloaded springs 47 may therefore be eliminated if, for example, the resulting impulse switch is to be rarely subjected to acceleration or deceleration pulses. In addition, the compressively preloaded spring 47 of FIGS. 4a, 5 and 6a may be similarly added to the embodiment 65 of FIG. 7 and mounted around the adjusting bolt 62.

Alternatively, the indicated lateral and wobbling stability of the relatively rigid plate 42 in the embodiment of FIG. 4a and the relatively rigid members 54 of the embodiments of FIGS. 5 and 6 may be provided by providing guides along which the elements can displace up and down (as viewed in FIGS. 4a-6). As an example, the relatively rigid plate 42 in the embodiment of FIG. 4a may be provided with a cylindrical guide 58, which can be integral to the relatively rigid plate 42. The housing is then provided with a mating pin 59, which can be integral to the housing 44, over which the cylindrical guide 58 can ride. As a result, the linear up and down displacement of the relatively rigid plate 42 is guided by the pin 59, preventing it from lateral movements as well as wobbling. Similar arrangements can be provided for the embodiments of FIGS. 5 and 6a, with or without the removal of the compressively preloaded spring 47. In the case of the embodiment 65 of FIG. 7, the relatively rigid plate 42 can be provided with a similar cylindrical guide (58 in FIG. 4b), which in this case can use the adjusting bolt 62 as the riding pin (59 in FIG. 4b).

It is appreciated that many components of the piezoelectric electrical energy generator embodiments of FIGS. 2-7 may be constructed as a single machined component to significantly reduce the number of parts and complexity of the device and its process of assembly and the overall cost of the unit. For example, consider the piezoelectric electrical energy generator embodiment of FIG. 6a. In this piezoelectric electrical energy generator, its relatively rigid members 54, the stops 57 and the compressively preloaded spring 46 may be constructed as a single machined unit 66 as shown in FIG. 6b. In this machined unit 66, the compressively preloaded spring 46 is provided by the helically machined spring section 67 as shown in the schematic of FIG. 6b. The function of the stops 57 is provided by the closing of the machined spring section 67 coils as the machined unit 66 is displaced downward as a result of acceleration of the piezoelectric electrical energy generator in the direction of the arrow 51.

Figure 8:
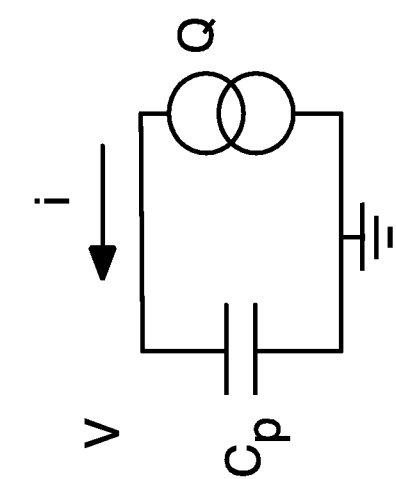
FIG. 8 illustrates a model of a piezoelectric element of used in the generators of FIGS. 2-7.

A stand-alone piezoelectric element (usually in stack construction) can be modeled as a capacitor $C_p$ connected in parallel to a charge source Q as shown in FIG. 8. The charge source Q generates a charge proportional to the axial (normal) strain of the piezoelectric element as it is subjected to axial (normal) loading, thereby sending the charge as current i to the capacitor $C_p$ of the piezoelectric element. The charges accumulated on the capacitor $C_p$ produces a voltage V, which is the so-called open-circuit voltage of the piezoelectric element. When the piezoelectric element is connected to another circuitry, the generated charge and current are the same, but due to the resulting charge exchange with the other circuitry, the in-circuit voltage of the piezoelectric element may be different from the open circuit voltage V.

Figure 9:
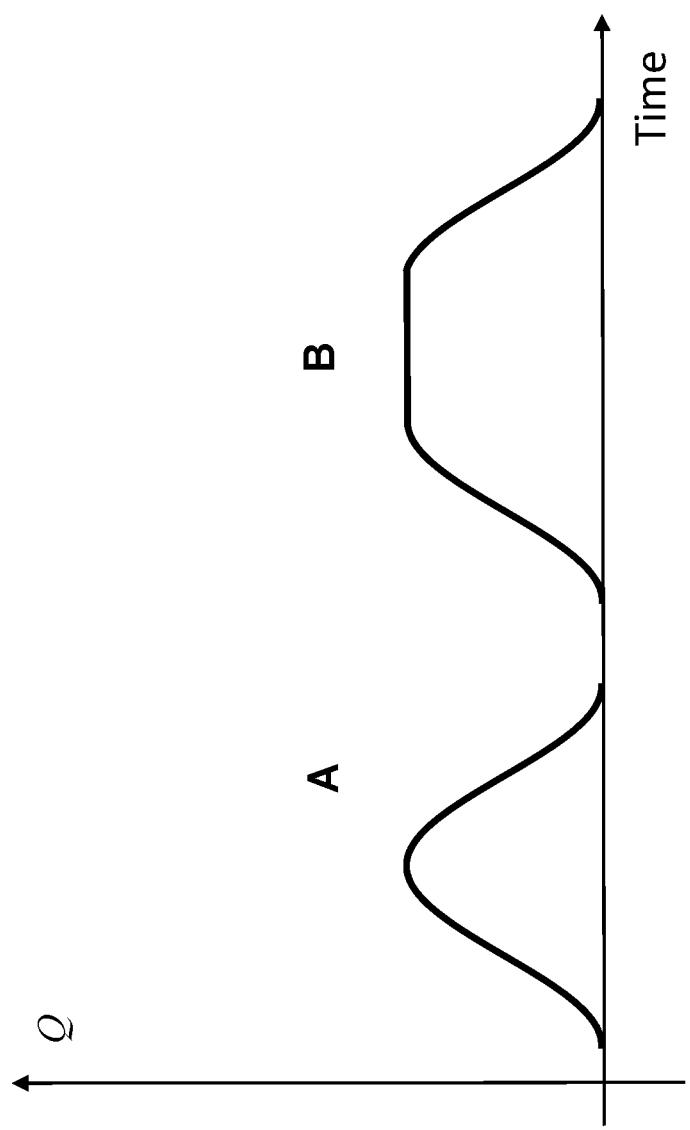
FIG. 9 illustrates plots of typical generated piezoelectric charges as a function time during a typical short duration acceleration pulse loading.

Two plots A and B of the profile of the open-circuit charge level on the piezoelectric element (FIG. 8) as it is subjected to a short duration acceleration pulse such as munitions firing or impact loading as a function of time are shown in FIG. 9. The maximum amount of charges Q (in Coulomb) is dependent on the size of the piezoelectric element and the resulting force level that is transmitted to the piezoelectric element. In most cases of interest, the acceleration pulse may be from tens of microseconds to several milliseconds in duration. The plot A of FIG. 9 illustrates the conditions in which the peak force transmitted to the piezoelectric element is not sustained for a period of time, such as in most impact type events. The plot B of FIG. 9 illustrates the conditions in which the peak force transmitted to the piezoelectric element is nearly maintained for a period of time, such as in many munitions firing.

Figure 10:
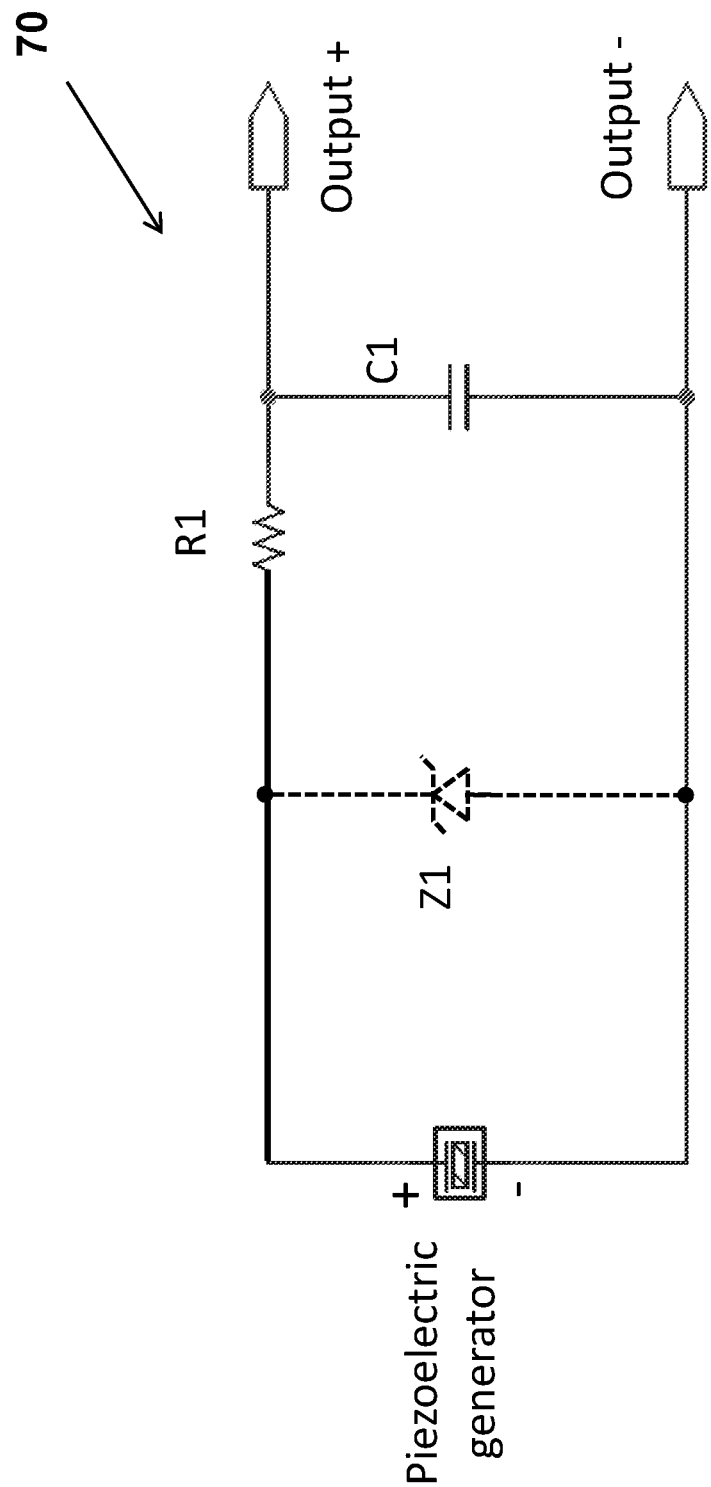

The first impulse switch embodiment 70 is shown in the circuit diagram of FIG. 10. The circuitry is seen to be passive since it does not require any external source of power or batteries or other similar sources of chemical or externally charged power sources for its operation. The "piezoelectric generator" shown in the circuit of FIG. 10 may be constructed as shown in any one of the embodiments of FIGS. 1-7, depending on the given application.

Now considering an impulse switch 70 that is constructed with one of the aforementioned piezoelectric electrical generator embodiments designed to respond to acceleration pulses, such as any of the embodiments of FIGS. 1-7. Now if the impulse switch is subjected to an acceleration pulse, the piezoelectric element would generate electrical charges with a profile similar to those shown in FIG. 9 depending on the applied acceleration profile. The circuit of FIG. 10 is shown to be provided with a resistor R1 and a capacitor C1, which together form a RC circuit to enforce a time delay for the voltage across the capacitor C1 ($V_{C1}$) to reach a certain threshold to indicate the occurrence of a high enough acceleration level with long enough duration that is intended to be detected.

In the impulse switch 70, the resistor R1 is generally desired to be very high so that the capacitor C1 can have very low capacitance to make it possible to make the impulse switch very small and low cost. The user can then determine the resistance of the resistor R1 to achieve the voltage threshold at the desired acceleration level and its duration. It is appreciated that if the acceleration is below the level or does not persist the long enough to charge the capacitor C1 to the threshold voltage that corresponding to the event to be detected, the threshold voltage will not be reached and as the acceleration level drops, the charges collected in the capacitor C1 are discharged back to the piezoelectric element.

In certain applications, the level of the acceleration pulse could be at times significantly higher than the acceleration threshold that is intended to correspond to the threshold voltage level generated by the piezoelectric electrical generator of the impulse switch but may be very short in its duration, such as the acceleration resulting by the dropping of a hard object on a hard surface. In some other applications, the impulse switch may be desired to detect events corresponding to accelerations above a certain level that last at least a prescribed length of time. In such applications, the charging voltage of the capacitor C1 of the circuit of the impulse switch embodiment of FIG. 10 may be limited by the use of a voltage limiting element, such as the Zener diode Z1 shown with dashed lines in the circuit of FIG. 10.

Figure 11:
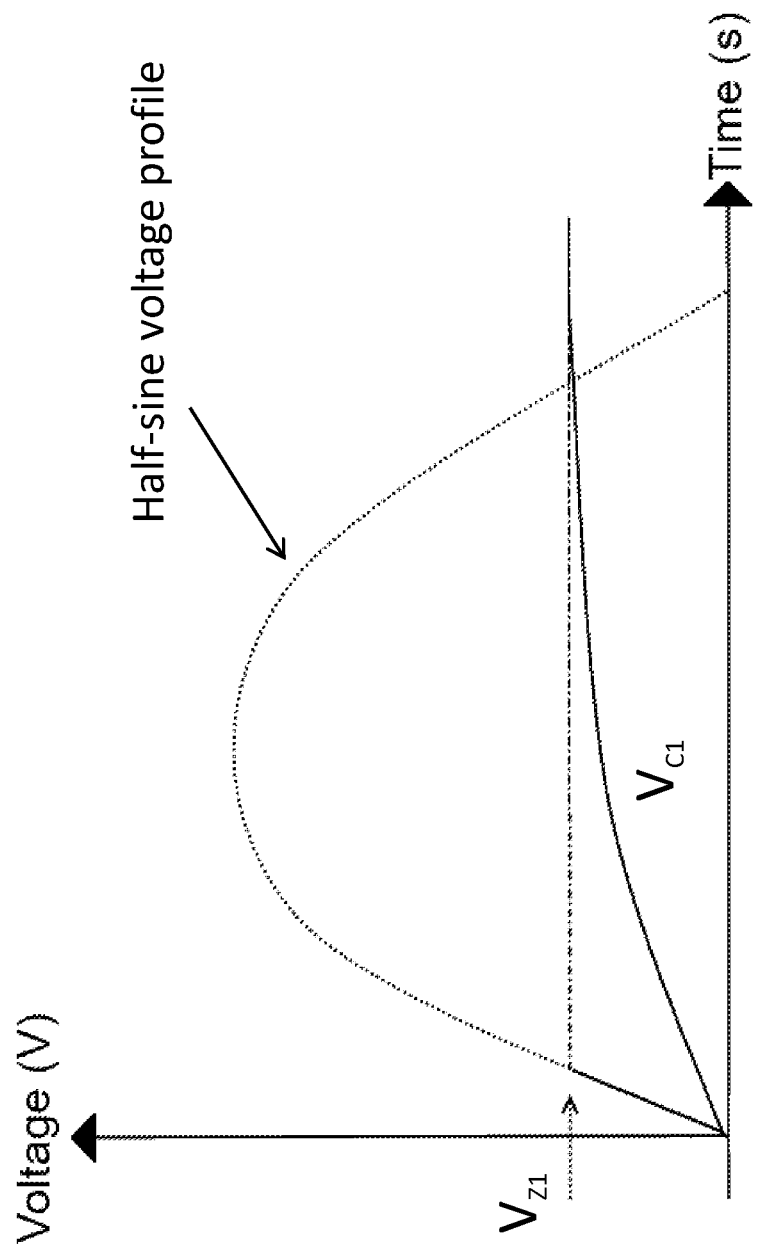
FIG. 11 the plot of the capacitor C1 voltage as a function of time with voltage limiting Zener diode due to a half-sine voltage profile generated by the piezoelectric element of the impulse switch.

As an example, consider a half sine voltage profile of FIG. 11, that is generated by the application of a half sine acceleration profile to the impulse sensor. It is appreciated that in the plot of FIG. 11 it is assumed that the capacitance of the capacitor C1 is very low compared to that of the piezoelectric element and the resistance of the resistor R1 is very high, thereby the amount of charge extracted from the piezoelectric element by the capacitor C1 and losses in the resistor R1 is neglected. The indicated voltage $V_{Z1}$ is considered to be the limiting voltage of the Zener diode. Then the voltage $V_{C1}$ of the capacitor C1 as a function of time becomes approximately as shown by the solid line. Thereby the user can, for example, readily determine the resistance of the capacitor C1 and/or the resistance of the resistor R1 to achieve a desired output voltage threshold (below the Zener diode voltage $V_{Z1}$) after a desired length of time.

It will be appreciated by those skilled in the art that since the piezoelectric element of the aforementioned piezoelectric electrical generator embodiments designed to respond to acceleration pulses, such as any of the embodiments of FIGS. 1-7, are desired to be very small and that in general the amount of charges that piezoelectric elements can generate is relatively small and is in the range of micro- or at most milli-Joule range, therefore not much current can be drawn from the impulse switch output, FIG. 10. As a result, the electronic circuit using the output of the circuit of FIG. 10 must be designed to draw a negligible amount of current from the impulse switch output to make it possible to detect the proper voltage level at the output to determine when the aforementioned threshold voltage level corresponding to the acceleration pulse event to be detected has been reached.

It will be appreciated by those skilled in the art that when the impulse switch 70 of FIG. 10 is constructed with piezoelectric electrical generator embodiments designed to respond to respond to both acceleration and deceleration pulses as was previously described, for example the piezoelectric electrical generator embodiments of FIGS. 2 and 3, then the impulse switch output voltage that is detected with have opposite polarity when an acceleration impulse is applied to the impulse switch and when a deceleration impulse is applied to the impulse switch. The used may obviously apply different voltage threshold levels for acceleration and deceleration pulses.

Figure 12:
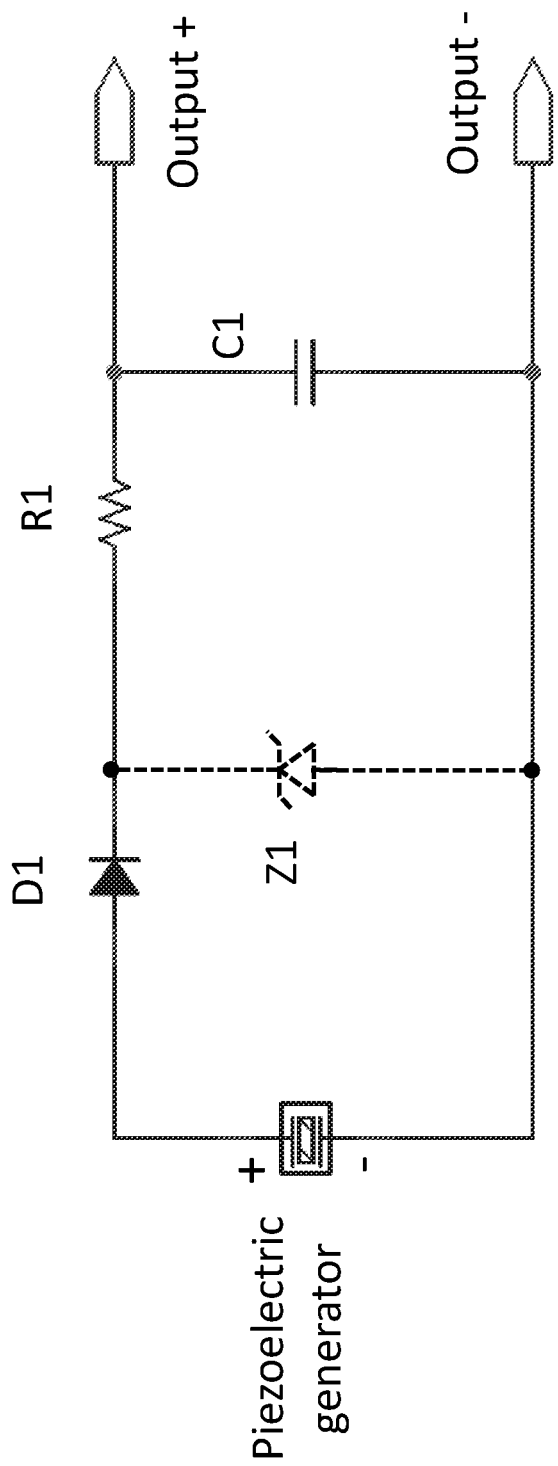
FIG. 12 illustrates the circuit diagram of the first impulse switch embodiment using one of the piezoelectric-based electrical energy generators shown schematically in FIGS. 1-7 or the like for identical response to acceleration and deceleration pulses.

However, in certain applications, the user may only be interested in detecting events that correspond the level of experience impulse, whether it is due to an applied acceleration pulse or a deceleration pulse. For example, when an impulse switch is used to trigger air bags to minimize passenger injury due to vehicle impact to the front of or aft of the vehicle, the impulse switch user may want to trigger air bag deployment as long as the acceleration pulse level is above certain threshold and that it lasts above certain amount of time. In such cases, to simplify the electronics used to detect the output of the impulse switch 70 of FIG. 10, the impulse switch may be provided with an added diode D1 as shown in FIG. 12, so that the impulse switch voltage polarity stays the same whether the impulse switch is subjected to an acceleration or deceleration pulse. It is, however, appreciated by those skilled in the art that the added diode D1 is desired to have a low forward voltage drop and a very fast switching action to detect fast rising voltage of the piezoelectric electrical generator due to suddenly applied acceleration pulses, such as those experience due to munitions firing or impacts with hard object, and to reduce energy loss in the circuitry. The indicated diode D1 must also have a high backward leakage, which is used as a safety feature in the present embodiment for discharging collected charges in the capacitor C1 when the voltage of the piezoelectric element drops below the prescribed threshold level to be detected following an acceleration or deceleration pulse that either below the prescribed threshold or its duration is shorter than the prescribed duration threshold, such as all no-fire conditions that could be experienced in munitions or when a vehicle encounters a pothole or a sharp bump.

It is appreciated by those skilled in the art that the piezoelectric electrical generator embodiments of FIGS. 2-7 may be used by other appropriate circuitry for acceleration and/or deceleration pulse detection, such as the electronic circuits disclosed in U.S. Pat. Nos. 8,042,469; 8,286,554; 8,776,688; 8,601,949; 8,596,198; 8,677,900; 9,097,502; 9,194,681; 9,587,924; 9,021,955 and 9,470,497 and U.S. Patent Application Publication Nos. 2015/0331008 and 2017/0133954, the contents of each of which are incorporated herein by reference. As an example, consider the prior art circuit of FIG. 13 (see U.S. Pat. No. 8,286,554). In this impulse switch circuit, the current due to the generated charges by the piezoelectric electrical generator embodiments of FIGS. 2-7 as a result of the applied acceleration and/or deceleration pulse is first rectified by the diode D1, the current due to the charges generated by the piezoelectric element passes through diode Z1 (such as a Zener or a similar diode) and resistor R1 to charge the capacitor C1 and also pass through resistors R2 and R3 to the ground. During this time, the diode D2 is under reverse bias, thereby passing a very small amount of current. The voltage on the capacitor C1 indicates the amount of energy generated by the piezoelectric element due to its (shock or vibration) loading, less the amount of energy drainage through the resistors R2 and R3 and the losses in the diode Z1 and smaller amounts in the remaining circuit elements. The resistors R2 and R3 also act as a programmable divider that can be used to adjust the output voltage level corresponding to the acceleration and/or deceleration level and duration threshold to be detected, such as a prescribed all-fire condition for gun-fired munitions, as demanded by the device/circuitry at the circuitry output shown in FIG. 13. It is also noted that the output and ground can also be used as a differential output.

Figure 13:
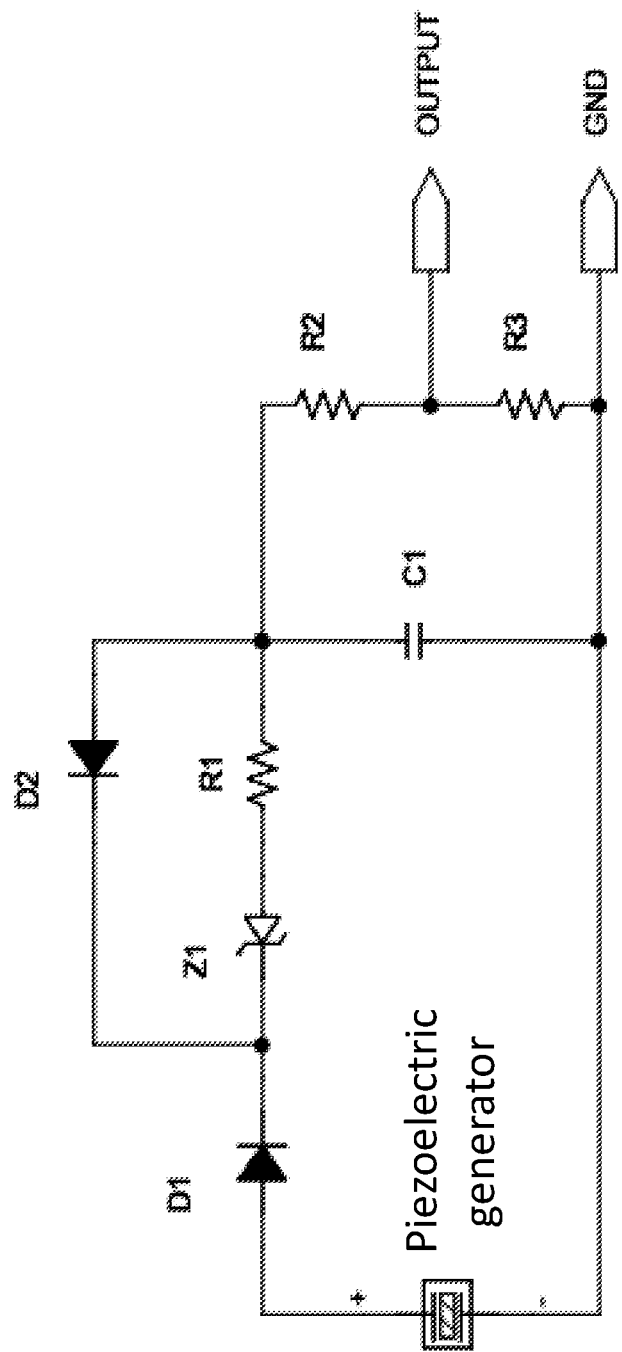
FIG. 13 illustrates the circuit diagram of another impulse switch embodiment using one of the piezoelectric-based electrical energy generators shown schematically in FIGS. 1-7 or the like with a prior art circuitry.

When the impulse switch with the circuitry shown in FIG. 13 is subjected to a relatively short duration shock loadings such as due to accidental dropping, the piezoelectric electrical generator embodiment (one of those of FIGS. 2-7) used in the construction of the impulse switch would generate relatively high voltage pulses with very short duration. The generated voltages may even be higher than the voltage level that are generated as the device is subjected to the prescribed acceleration and/or deceleration threshold levels, but the duration of such pulses is significantly shorter than those of the prescribed acceleration and/or deceleration duration threshold. For example, in the case of munitions firing, an all-fire acceleration may be around 900 G with 10 milliseconds of duration while an accidental drop may cause a shock loading of up to 2,000 G but for a very short duration of less than 0.5 millisecond. In the impulse switch using the circuit of FIG. 13, the capacitor C1 and the resistor R1 are sized such that the resulting charging time constant (R1C1) for the capacitor C1 is significantly longer than such "high voltage and short duration" pulses, thereby ensuring that the capacitor C1 is not charged to the aforementioned "all-fire voltage level" due to any no-fire shock loading event. In addition, to ensure that the charges due to several such "high voltage and short duration" pulses do not accumulate in the capacitor C1 and provide a false "all-fire voltage level" indication, the diode D2 is provided to discharge all accumulated charges in the capacitor C1 once the piezoelectric voltage drops below the voltage level on C1.

While there has been shown and described what is considered to be preferred embodiments, it will, of course, be understood that various modifications and changes in form or detail could readily be made without departing from the spirit of the invention. It is therefore intended that the invention be not limited to the exact forms described and illustrated, but should be constructed to cover all modifications that may fall within the scope of the appended claims.

What is claimed is:

1. A piezoelectric generator for generating power upon an acceleration and upon a deceleration of a body, the piezoelectric generator comprising:
   a mass;
   a movable plate;
   one or more stops disposed on at least one of the plate and the body for limiting a movement of the plate in a direction of the acceleration;
   a first spring connected to the plate at one end and to the mass at an other end;
   a second spring connected to the body at one end and to the plate at an other end for biasing the plate away from the one or more stops; and
   a piezoelectric material connected to the first spring and to the body such that the piezoelectric material generates power when the body is accelerated or decelerated.

2. The piezoelectric generator of claim 1, further comprising one or more third springs connected to the body at one end and to the plate at another end for biasing the plate towards the one or more stops.

3. The piezoelectric generator of claim 1, further comprising:
   a pin connected to the body; and
   a guide for riding on the pin to limit a transverse movement of the plate.

4. The piezoelectric generator of claim 1, further comprising a means for varying an amount of preloading of the first spring.

5. An impulse switch comprising:
  the piezoelectric generator of claim 1; and
  a circuit for outputting a power from the piezoelectric generator only upon an acceleration or declaration event having a predetermined magnitude and duration.

* * * * *